United States Patent
Kitagawa (10) Patent No.: US 9,082,810 B2
(45) Date of Patent: Jul. 14, 2015

(54) SEMICONDUCTOR DEVICE (71) Applicant: KABUSHIKI KAISHA TOSHIBA, Minato-ku (JP)

(72) Inventor: Mitsuhiko Kitagawa, Tokyo (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 35 days.

(21) Appl. No.: 13/971,124

(22) Filed: Aug. 20, 2013

(65) Prior Publication Data
US 2014/0077257 A1    Mar. 20, 2014

(30) Foreign Application Priority Data

Sep. 19, 2012 (JP) ................................. 2012-206073

(51) Int. Cl.
*H01L 29/06* (2006.01)
*H01L 29/739* (2006.01)
(Continued)

(52) U.S. Cl.
CPC .......... *H01L 29/7393* (2013.01); *H01L 29/063* (2013.01); *H01L 29/0661* (2013.01); *H01L 29/0696* (2013.01); *H01L 29/407* (2013.01); *H01L 29/41741* (2013.01); *H01L 29/7397* (2013.01)

(58) Field of Classification Search
CPC .............. H01L 29/063; H01L 29/0661; H01L 29/0696; H01L 29/407; H01L 29/41741; H01L 29/7393; H01L 29/7397
USPC ......................................... 257/490, 492–496
See application file for complete search history.

(56) References Cited

U.S. PATENT DOCUMENTS

| | | | | |
|---|---|---|---|---|
| 5,959,345 A | * | 9/1999 | Fruth et al. | 257/605 |
| 7,649,213 B2 | * | 1/2010 | Hatakeyama et al. | 257/127 |
| 7,649,223 B2 | * | 1/2010 | Kawashima | 257/332 |

(Continued)

FOREIGN PATENT DOCUMENTS

| | | |
|---|---|---|
| JP | 2008-147361 A | 6/2008 |
| JP | 2010-225833 A | 10/2010 |

(Continued)

OTHER PUBLICATIONS

R. Ng et al., "Lateral Unbalanced Duper Junction (USJ) /3D-Resurf for High Breakdown Voltage on SOI", Proceedings of 2001 International Symposium on Power Semiconductor Devices & ICs, Osaka, pp. 395-398.

(Continued)

*Primary Examiner* — Earl Taylor
(74) *Attorney, Agent, or Firm* — White & Case LLP (57) ABSTRACT

In one embodiment, a semiconductor device includes a semiconductor substrate, a device portion disposed in the semiconductor substrate, and a junction terminal portion disposed in the semiconductor substrate and having an annular shape surrounding the device portion. The junction terminal portion includes first semiconductor regions of a first conductivity type and second semiconductor regions of a second conductivity type. The first semiconductor regions are adjacent to each other in a circumferential direction of the annular shape of the junction terminal portion, and have a width decreasing with progressing in a direction away from the device portion. The second semiconductor regions are disposed between the first semiconductor regions, and have a width increasing with progressing in the direction away from the device portion.

20 Claims, 7 Drawing Sheets

(51) Int. Cl.
*H01L 29/40* (2006.01)
*H01L 29/417* (2006.01)

(56) References Cited

U.S. PATENT DOCUMENTS

| | | | |
|---|---|---|---|
| 7,772,641 B2 * | 8/2010 | Omura et al. | 257/330 |
| 8,338,907 B2 * | 12/2012 | Aoki | 257/493 |
| 8,395,211 B2 * | 3/2013 | Sasaki | 257/335 |
| 8,395,230 B2 * | 3/2013 | Hozumi et al. | 257/493 |
| 8,404,526 B2 * | 3/2013 | Sasaki | 438/140 |
| 8,421,152 B2 * | 4/2013 | Sasaki | 257/339 |
| 8,598,657 B2 * | 12/2013 | Tamaki et al. | 257/342 |
| 8,716,717 B2 * | 5/2014 | Kawakami et al. | 257/76 |
| 8,803,251 B2 * | 8/2014 | Lee et al. | 257/409 |
| 8,803,277 B2 * | 8/2014 | Henning et al. | 257/496 |
| 2006/0131685 A1 * | 6/2006 | Watanabe et al. | 257/483 |
| 2008/0169526 A1 * | 7/2008 | Wakimoto et al. | 257/490 |
| 2010/0032791 A1 * | 2/2010 | Hozumi et al. | 257/493 |
| 2011/0147880 A1 * | 6/2011 | Matthias et al. | 257/504 |
| 2011/0284957 A1 * | 11/2011 | Tamaki et al. | 257/339 |
| 2012/0205666 A1 * | 8/2012 | Henning et al. | 257/77 |
| 2013/0020671 A1 * | 1/2013 | Lee et al. | 257/490 |
| 2013/0140582 A1 * | 6/2013 | Kawakami et al. | 257/76 |
| 2013/0161645 A1 * | 6/2013 | Takahashi | 257/77 |
| 2014/0077257 A1 * | 3/2014 | Kitagawa | 257/139 |
| 2014/0266407 A1 * | 9/2014 | Chen et al. | 327/534 |

FOREIGN PATENT DOCUMENTS

| | | |
|---|---|---|
| JP | 2011-114028 A | 6/2011 |
| JP | 2011-139061 A | 7/2011 |
| JP | 2008-103530 A | 5/2013 |

OTHER PUBLICATIONS

F. Udrea et al., "Ultra-high voltage device termination using the 3D Resurf (Super-Junction) concept—experimental demonstration at 6.5 kV", Proceedings of 2001 International Symposium on Power Semiconductor Devices & ICs, Osaka, pp. 129-132.

* cited by examiner

SEMICONDUCTOR DEVICE

CROSS REFERENCE TO RELATED APPLICATION

This application is based upon and claims the benefit of priority from the prior Japanese Patent Application No. 2012-206073, filed on Sep. 19, 2012, the entire contents of which are incorporated herein by reference.

FIELD

Embodiments described herein relate to a semiconductor device.

BACKGROUND

When a power semiconductor device is designed, a structure of a junction terminal portion for securing main breakdown voltage is important. For example, the power semiconductor device including a MOS power transistor such as an insulated gate bipolar transistor (IGBT) secures the main breakdown voltage by a RESURF, a guard ring, a field plate or the like. However, these structures have a problem that when a size of the junction terminal portion is reduced by decreasing a width of the junction terminal portion or by decreasing a depth of a diffusion layer in the junction terminal portion to shrink the size of circuits, it is difficult to secure the main breakdown voltage.

DETAILED DESCRIPTION

Embodiments will now be explained with reference to the accompanying drawings.

In one embodiment, a semiconductor device includes a semiconductor substrate, a device portion disposed in the semiconductor substrate, and a junction terminal portion disposed in the semiconductor substrate and having an annular shape surrounding the device portion. The junction terminal portion includes first semiconductor regions of a first conductivity type and second semiconductor regions of a second conductivity type. The first semiconductor regions are adjacent to each other in a circumferential direction of the annular shape of the junction terminal portion, and have a width decreasing with progressing in a direction away from the device portion. The second semiconductor regions are disposed between the first semiconductor regions, and have a width increasing with progressing in the direction away from the device portion.

First Embodiment

Figure 1A:
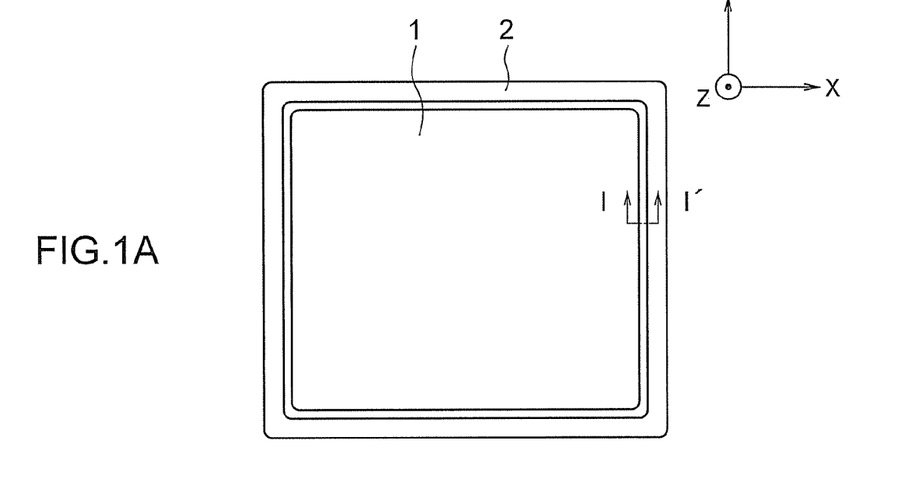
FIGS. 1A and 1B are a plan view and a sectional view showing a structure of a semiconductor device of a first embodiment.
Figure 1B:
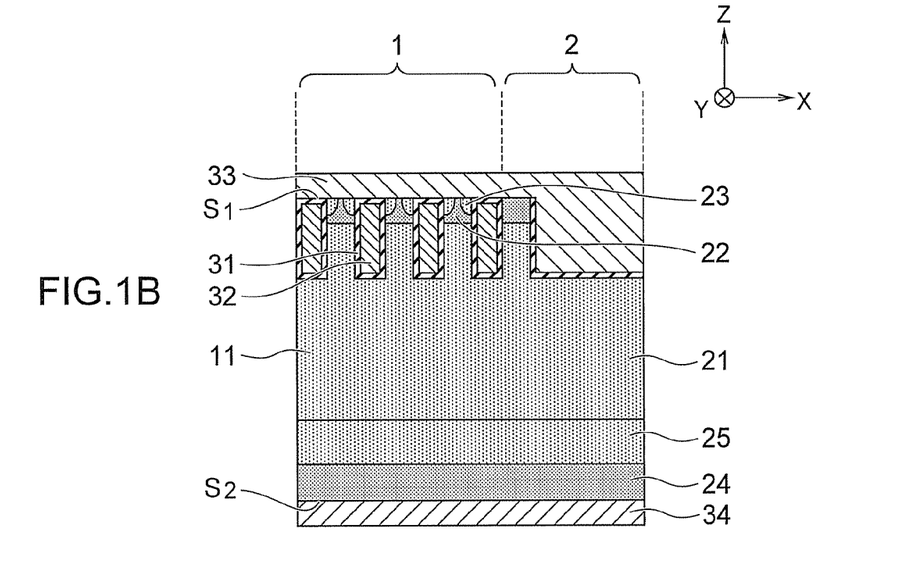

FIGS. 1A and 1B are a plan view and a sectional view showing a structure of a semiconductor device of a first embodiment. FIG. 1A is the plan view schematically showing the structure of the semiconductor device, and FIG. 1B is the sectional view taken along the line I-I' in FIG. 1A.

The semiconductor device of the present embodiment includes a semiconductor substrate 11, a device portion 1 formed in the semiconductor substrate 11 and including a power transistor (e.g., IGBT), and a junction terminal portion 2 formed in the semiconductor substrate 11 and having an annular shape surrounding the device portion 1.

The semiconductor substrate 11 is, for example, a silicon substrate. Symbols $S_1$ and $S_2$ respectively indicate a first main surface (front surface) and a second main surface (back surface) of the semiconductor substrate 11. FIGS. 1A and 1B illustrate X and Y directions which are parallel to the main surfaces of the semiconductor substrate 11 and perpendicular to each other, and a Z direction which is perpendicular to the main surfaces of the semiconductor substrate 11.

The semiconductor substrate 11 includes an N--type first base layer 21, P+-type second base layers 22, N+-type source layers (emitter layers) 23, a P+-type drain layer (collector layer) 24, and an N-type buffer layer 25.

The first base layer 21 is a high resistivity layer in the semiconductor substrate 11. The second base layers 22 are formed on a surface of the first base layer 21 on the first main surface $S_1$ side in the device portion 1. The source layers 23 are formed on surfaces of the second base layers 22 in the device portion 1. The drain layer 24 is formed on a surface of the first base layer 21 on the second main surface $S_2$ side. The buffer layer 25 is formed between the first base layer 21 and the drain layer 24.

The semiconductor device of the present embodiment further includes gate insulators 31, gate electrodes 32, a source electrode (emitter electrode) 33, and a drain electrode (collector electrode) 34.

The gate insulators 31 are formed on side and bottom surfaces of trenches formed on the first main surface $S_1$ of the semiconductor substrate 11. The gate insulators 31 are, for example, silicon oxide layers. The gate electrodes 32 are formed in these trenches via the gate insulators 31. The gate electrodes 32 are, for example, polysilicon layers. The source electrode 33 and the drain electrode 34 are respectively formed on the first and second main surfaces $S_1$ and $S_2$ of the semiconductor substrate 11. A portion of the source electrode 33 is embedded in a trench formed on the first main surface $S_1$ of the semiconductor substrate 11 via an insulator in the junction terminal portion 2.

(1) Structure of Junction Terminal Portion 2 of First Embodiment

A structure of the junction terminal portion 2 of the first embodiment will be described referring to FIGS. 2A and 2B.

Figure 2A:
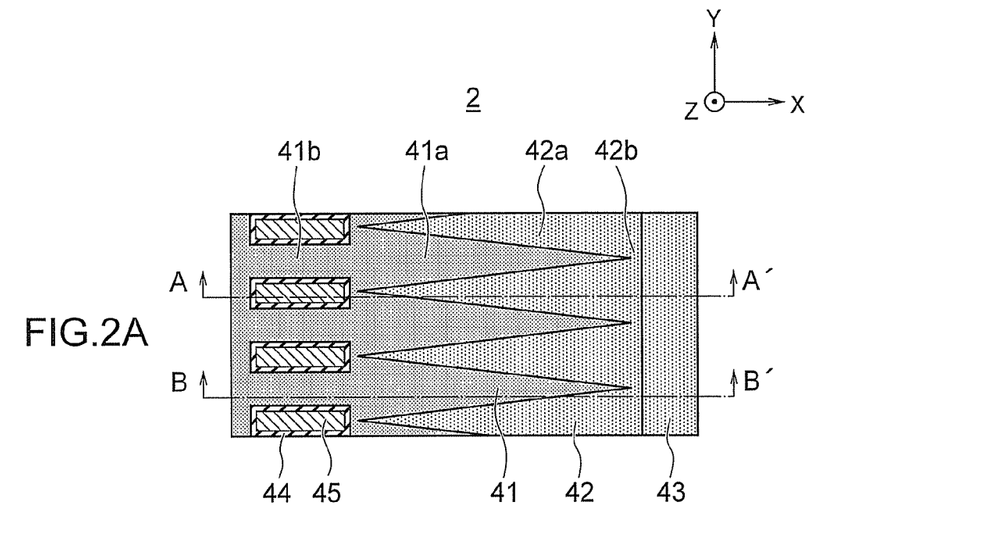
FIGS. 2A and 2B are a plan view and a sectional view showing a structure of a junction terminal portion of the first embodiment.
Figure 2B:
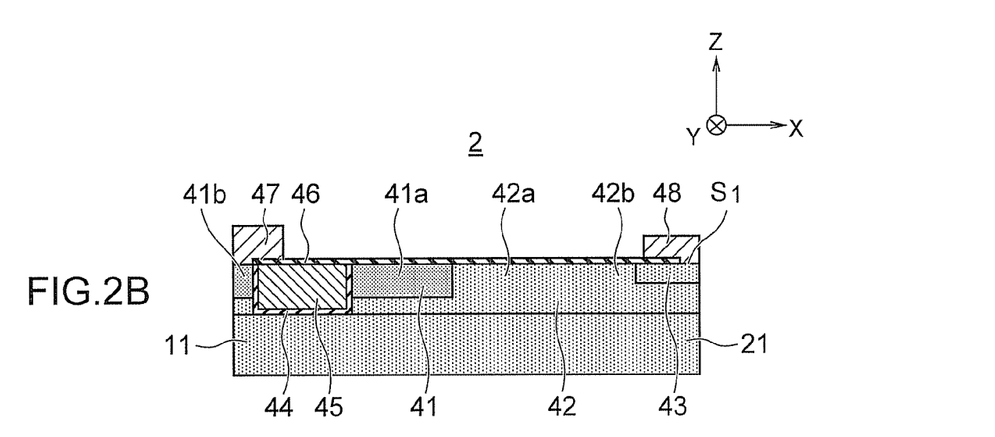

FIGS. 2A and 2B are a plan view and a sectional view showing the structure of the junction terminal portion 2 of the first embodiment. FIG. 2A is the plan view showing the structure of the junction terminal portion 2 near the line I-I' in FIG. 1A, and FIG. 2B is the sectional view taken along the line A-A' in FIG. 2A.

As illustrated in FIGS. 2A and 2B, the junction terminal portion 2 includes a P-type diffusion layer 41, an N-type diffusion layer 42, and an N+-type diffusion layer 43 which are formed in the semiconductor substrate 11, trench insulators 44 and trench electrodes 45 which have similar structures as the gate insulators 31 and the gate electrodes 32, an insulator 46, a first electrode 47 corresponding to the source electrode 33, and a second electrode 48 having a similar electric potential as the drain electrode 34.

The P-type diffusion layer 41 includes P-type stripe regions 41a which extend in a direction away from the device portion 1 (herein, +X direction) and are adjacent to each other in a circumferential direction of the annular shape of the junction terminal portion 2 (herein, +Y or −Y direction), and a P-type connection region 41b which connects the P-type stripe regions 41a. Each P-type stripe region 41a has a triangular planar shape, and has a Y-directional width decreasing with progressing in the +X direction. The P-type stripe regions 41a and the P-type connection region 41b are respectively examples of first semiconductor regions and first connection regions of the disclosure. The P-conductivity type is an example of a first conductivity type of the disclosure.

The N-type diffusion layer 42 includes N-type stripe regions 42a which extend in the direction away from the device portion 1 (the +X direction) and are disposed between the P-type stripe regions 41a, and an N-type connection region 42b which connects the N-type stripe regions 42a. Each N-type stripe region 42a has a triangular planar shape as similarly to the P-type stripe regions 41a. However, unlike the P-type stripe regions 41a, each N-type stripe region 42a has a Y-directional width increasing with progressing in the +X direction. The N-type stripe regions 42a and the N-type connection region 42b are respectively examples of second semiconductor regions and a second connection region of the disclosure. The N-conductivity type is an example of a second conductivity type of the disclosure.

The N+-type diffusion layer 43 is disposed on the +X direction side of the N-type diffusion layer 42. The trench insulators 44 are formed on side and bottom surfaces of trenches which are formed to penetrate the P-type connection region 41b. The trench electrodes 45 are formed in these trenches via the trench insulators 44.

The insulator 46 is formed on the P-type diffusion layer 41, the N-type diffusion layer 42, the N+-type diffusion layer 43, and the trench electrodes 45. The first electrode 47 is formed on the insulator 46 and the P-type connection region 41b. The second electrode 48 is formed on the insulator 46 and the N+-type diffusion layer 43.

As illustrated in FIG. 2B, N-type impurities in the N-type diffusion layer 42 are diffused deeper than P-type impurities in the P-type diffusion layer 41, and a bottom surface of the N-type diffusion layer 42 is located deeper than a bottom surface of the P-type diffusion layer 41 in the present embodiment. In addition, the N-type impurities in the N-type diffusion layer 42 are diffused deeper than N-type impurities in the N+-type diffusion layer 43, and the bottom surface of the N-type diffusion layer 42 is located deeper than a bottom surface of the N+-type diffusion layer 43 in the present embodiment. In the present embodiment, the N-type diffusion layer 42 expands to a region below the P-type diffusion layer 41 and the N+-type diffusion layer 43, and is in contact with the bottom surfaces of the P-type diffusion layer 41 and the N+-type diffusion layer 43.

In the present embodiment, bottom surfaces of the trench electrodes 45 are located deeper than the bottom surface of the P-type diffusion layer 41, and are substantially located at the same depth as the bottom surface of the N-type diffusion layer 42.

In the present embodiment, a Z-directional thickness of the P-type diffusion layer 41 is set to, for example, 2 µm. An X-directional length of the P-type stripe regions 41a and the N-type stripe regions 42a is set to, for example, 90 µm. An X-directional length of the trench electrodes 45 is set to, for example, 5 µm.

Herein, a dose amount of the P-type impurities in the P-type diffusion layer 41 is expressed by Cp [1/cm$^2$], and a dose amount of the N-type impurities in the N-type diffusion layer 42 is expressed by Cn [1/cm$^2$]. The dose amounts Cp and Cn respectively correspond to the number of P-type impurity atoms and the number of N-type impurity atoms doped per unit area on the main surface of the semiconductor substrate 11. It is noted that the dose amount of the N-type impurities in the N-type diffusion layer 42 below the P-type diffusion layer 41 is a dose amount also including the N-type impurities in this P-type diffusion layer 41.

In the present embodiment, both the dose amounts Cp and Cn are uniform, and the dose amounts Cp and Cn are substantially constant in the P-type diffusion layer 41 and the N-type diffusion layer 42. The dose amount Cp is larger than the dose amount Cn (Cp>Cn) in the present embodiment. For example, the dose amount Cp is set twice to four times larger than the dose amount Cn (2×Cn≤Cp≤4×Cn).

Continuously referring to FIGS. 2A and 2B, effects of the junction terminal portion 2 having the structure as described above will be described.

As mentioned above, the junction terminal portion 2 of the present embodiment includes the P-type stripe regions 41a and the N-type stripe regions 42a which are alternately disposed along the Y direction in FIGS. 2A and 2B. In other words, the junction terminal portion 2 of the present embodiment has a so-called super junction structure. Such structure has an advantage that a sufficient main breakdown voltage is easily secured even if the size of the junction terminal portion 2 is reduced by decreasing the X-directional width of the junction terminal portion 2 or by decreasing the Z-direction depth of the diffusion layers 41 to 43.

In the present embodiment, the width of the p-type stripe regions 41a decreases with progressing in the direction away from the device portion 1, and the width of the N-type stripe regions 42a increases with progressing in the direction away from the device portion 1.

Accordingly, in the junction terminal portion 2 of the present embodiment, when the dose amounts of the P-type impurities and the N-type impurities are averaged over the entire P-type stripe regions 41a and N-type stripe regions 42a, an average dose amount of the P-type impurities in the P-type and N-type stripe regions 41a and 42a gradually decreases with getting away from the device portion 1, and an average dose amount of the N-type impurities in the P-type and N-type stripe regions 41a and 42a gradually increases with getting away from the device portion 1. In other words, gradations in change of the dose amounts of the P-type impurities and the N-type impurities are realized in the junction terminal portion 2 of the present embodiment.

Such structure has an advantage that a depletion layer can be equally extended in the direction away from the device portion 1. Consequently, according the present embodiment, it is easier to secure the sufficient main breakdown voltage even if the size of the junction terminal portion 2 is reduced.

In the present embodiment, since the width of the P-type stripe regions 41a decreases with getting away from the device portion 1 and the width of the N-type stripe regions 42a increases with getting away from the device portion 1, the above-described gradations can be realized even if the dose amounts Cp and Cn are set to be uniform. Therefore, it is not required in the present embodiment to form complicated P-type and N-type diffusion layers 41 and 42 which have varying dose amounts Cp and Cn. The above-described gradations can be realized in the present embodiment by a simple diffusion layer forming process which forms P-type and N-type diffusion layers 41 and 42 having uniform dose amounts Cp and Cn.

In the present embodiment, the dose amount Cp is larger than the dose amount Cn, and more specifically, the dose amount Cp is set twice to four times larger than the dose amount Cn. In the present embodiment, such setting is employed considering the difference between electron mobility and hole mobility and considering that the depletion layer is made to extend from the P-type diffusion layer 41 to the N-type diffusion layer 42.

(2) Structures of Junction Terminal Portions 2 of Modifications of First Embodiment Structures of junction terminal portions 2 of modifications of the first embodiment will be described referring to FIG. 3 and FIGS. 4A and 4B.

Figure 3:
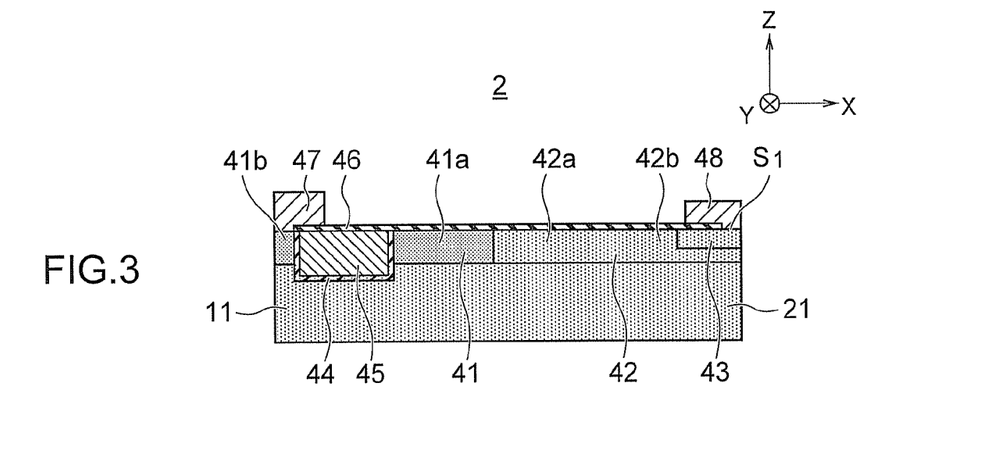
FIG. 3 is a sectional view showing a structure of a junction terminal portion of a modification of the first embodiment.

FIG. 3 is a sectional view showing a structure of a junction terminal portion 2 of a modification of the first embodiment. FIG. 3 is the sectional view taken along the line A-A' in FIG. 2A.

In FIGS. 2A and 2B, the N-type impurities in the N-type diffusion layer 42 are diffused deeper than the P-type impurities in the P-type diffusion layer 41, and the bottom surface of the N-type diffusion layer 42 is located deeper than the bottom surface of the P-type diffusion layer 41. In contrast to this, in FIG. 3, the bottom surface of the N-type diffusion layer 42 is substantially located at the same depth as the bottom surface of the P-type diffusion layer 41. In the present embodiment, the structure in FIG. 3 may be employed in place of the structure in FIGS. 2A and 2B.

When the bottom surface of the P-type diffusion layer 41 and the bottom surface of the N-type diffusion layer 42 are substantially located at the same depth as in FIG. 3, it is desirable that a peak concentration of the P-type impurities in the P-type diffusion layer 41 ($1/cm^3$) is set twice to four times higher than a peak concentration of the N-type impurities in the N-type diffusion layer 42 ($1/cm^3$).

Figure 4A:
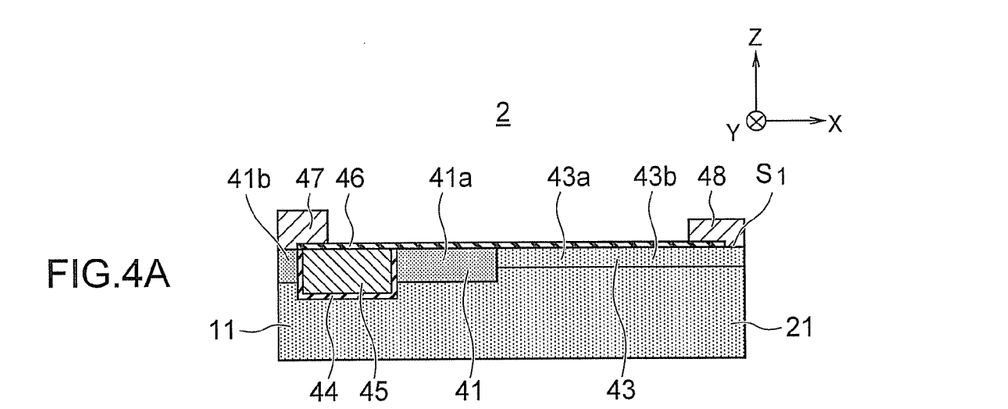
FIGS. 4A and 4B are sectional views showing a structure of a junction terminal portion of another modification of the first embodiment.
Figure 4B:
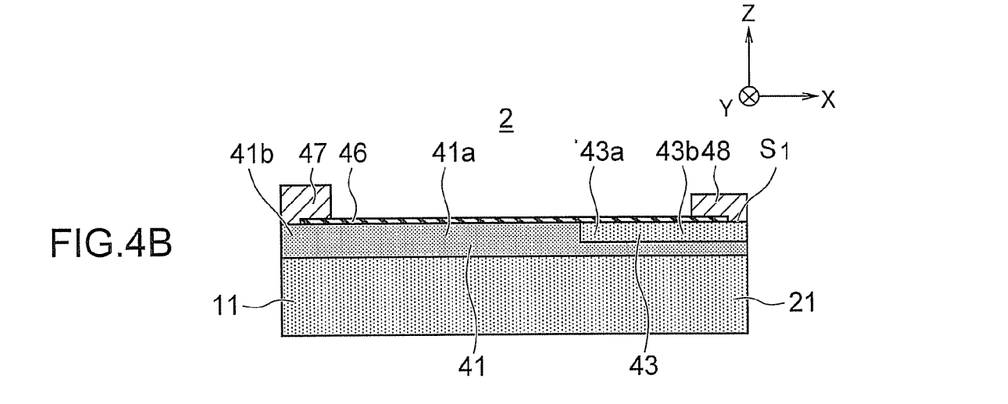

FIGS. 4A and 4B are sectional views showing a structure of a junction terminal portion 2 in another modification of the first embodiment. FIGS. 4A and 4B are the sectional views respectively taken along the line A-A' and the line B-B' in FIG. 2A.

The junction terminal portion 2 in FIGS. 4A and 4B do not include the N-type diffusion layer 42. Instead, in the junction terminal portion 2 in FIGS. 4A and 4B, the N+-type diffusion layer 43 includes N+-type stripe regions 43a extending in the direction away from the device portion 1 (the +X direction) and disposed between the P-type stripe regions 41a, and an N+-type connection region 43b connecting the N+-type stripe regions 43a. The N+-type stripe regions 43a and the N+-type connection region 43b in FIGS. 4A and 4B are respectively examples of second semiconductor regions and a second connection region of the disclosure.

The structure of the N+-type diffusion layer 43 in FIGS. 4A and 4B is similar to the structures of the N-type diffusion layers 42 in FIGS. 2A and 2B and FIG. 3. However, in FIGS. 4A and 4B, the P-type impurities in the P-type diffusion layer 41 are diffused deeper than the N-type impurities in the N+-type diffusion layer 43, and the bottom surface of the P-type diffusion layer 41 is located deeper than the bottom surface of the N+-type diffusion layer 43. In addition, in FIGS. 4A and 4B, the P-type diffusion layer 41 partially expands to a region below the N+-type diffusion layer 43, and is in contact with the bottom surface of the N+-type diffusion layer 43. In the present embodiment, the structure in FIGS. 4A and 4B may be employed in place of the structure in FIGS. 2A and 2B.

(3) Effects of First Embodiment

Effects of the first embodiment will be described.

As described above, the junction terminal portion 2 of the present embodiment includes the P-type stripe regions 41a and the N-type stripe regions 42a which are alternately disposed along the circumferential direction of the annular shape of the junction terminal portion 2. In the present embodiment, the width of the p-type stripe regions 41a decreases with progressing in the direction away from the device portion 1, and the width of the N-type stripe regions 42a increases with progressing in the direction away from the device portion 1.

Therefore, according to the present embodiment, it is possible to secure a sufficient breakdown voltage with a small-sized junction terminal portion 2 by forming the junction terminal portion 2 in such a manner that the average dose amounts of the P-type impurities and the N-type impurities gradually changes with getting away from the device portion 1, for example.

In the present embodiment, the planar shape of each P-type and N-type stripe regions 41a and 42a may be a shape other than the triangle, if the width of the p-type stripe regions 41a decreases with getting away from the device portion 1 and the width of the N-type stripe regions 42a increases with getting away from the device portion 1. For example, the planar shape of each P-type and N-type stripe regions 41a and 42a may be formed in such a manner that the width of them decreases or increases in a staircase pattern with getting away from the device portion 1.

Second Embodiment

Figure 5A:
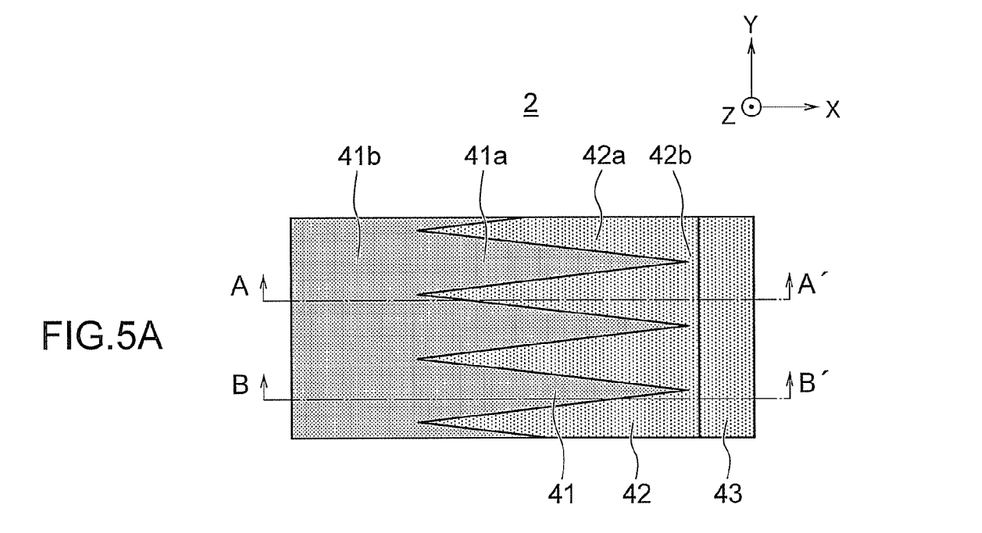
FIGS. 5A and 5B are a plan view and a sectional view showing a structure of a junction terminal portion of a second embodiment.
Figure 5B:
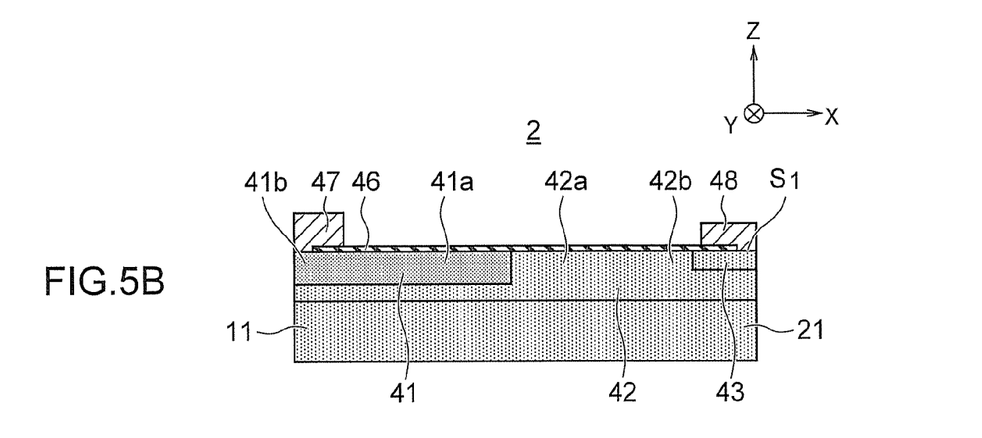

FIGS. 5A and 5B are a plan view and a sectional view showing a structure of a junction terminal portion 2 of a second embodiment. FIG. 5A is the plan view showing the structure of the junction terminal portion 2 near the line I-I' in FIG. 1A, and FIG. 5B is the sectional view taken along the line A-A' in FIG. 5A.

The junction terminal portion 2 in FIGS. 5A and 5B has a structure similar to the junction terminal portion 2 in FIGS. 2A and 2B, but does not include the trench insulators 44 and the trench electrodes 45. In this way, the structure in which the P-type stripe regions 41a and the N-type stripe regions 42a are alternately disposed is applicable not only to the trench-type junction terminal portion 2 but also to the non-trench-type junction terminal portion 2.

Figure 6:
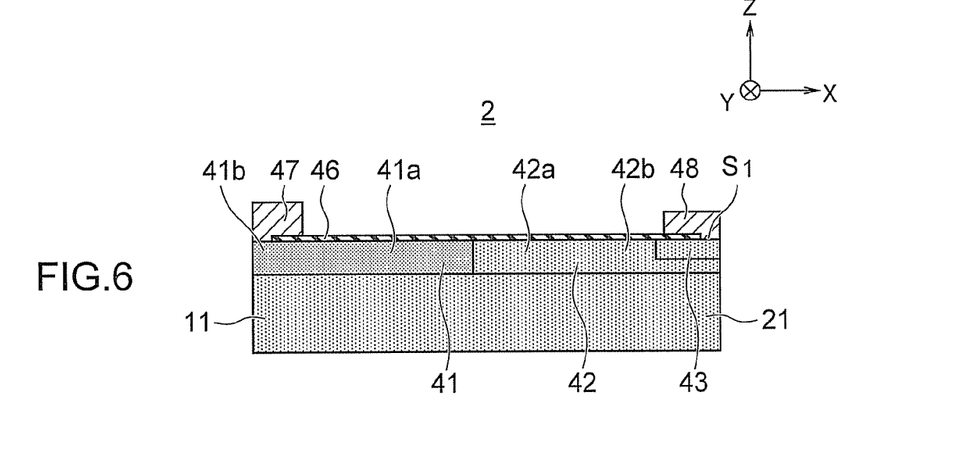
FIG. 6 is a sectional view showing a structure of a junction terminal portion of a modification of the second embodiment.
Figure 7A:
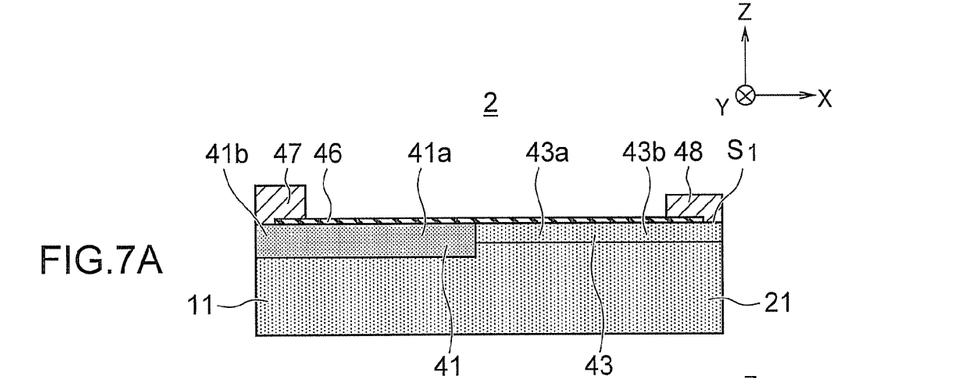
FIGS. 7A and 7B are sectional views showing a structure of a junction terminal portion of another modification of the second embodiment.
Figure 7B:
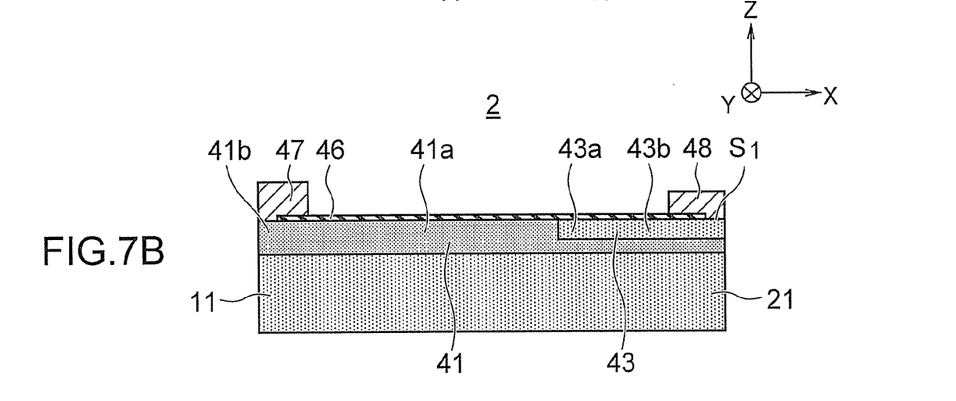

FIG. 6 and FIGS. 7A and 7B are sectional views showing structures of junction terminal portions 2 of modifications of the second embodiment.

The junction terminal portions 2 in FIG. 6 and FIGS. 7A and 7B respectively have structures similar to the junction terminal portions 2 in FIG. 3 and FIGS. 4A and 4B except that the trench insulators 44 and the trench electrodes 45 are not included. In this way, the structures in FIGS. 2A to 4B are applicable not only to the trench-type junction terminal portion 2 but also to the non-trench-type junction terminal portion 2.

According to the present embodiment, a sufficient breakdown voltage can be secured by a small-sized junction terminal portion 2, as similarly to the first embodiment.

Third Embodiment

Figure 8A:
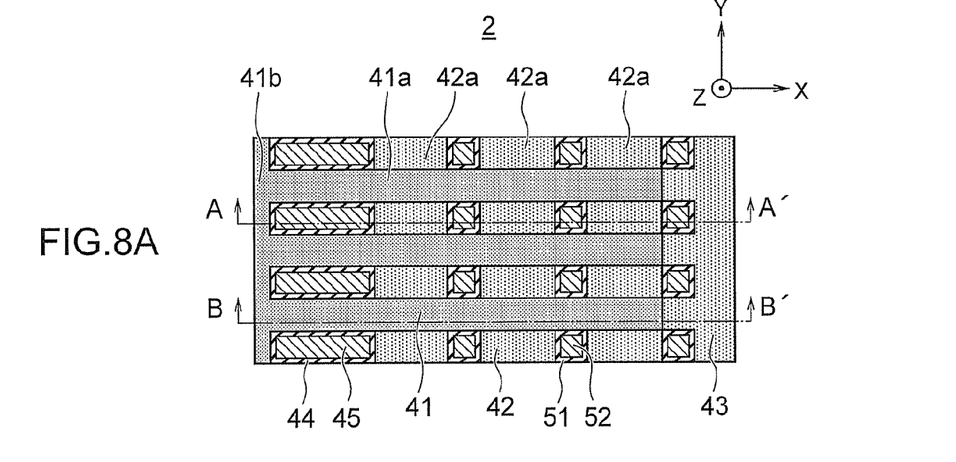
FIGS. 8A to 8C are a plan view and sectional views showing a structure of a junction terminal portion of a third embodiment.
Figure 8B:
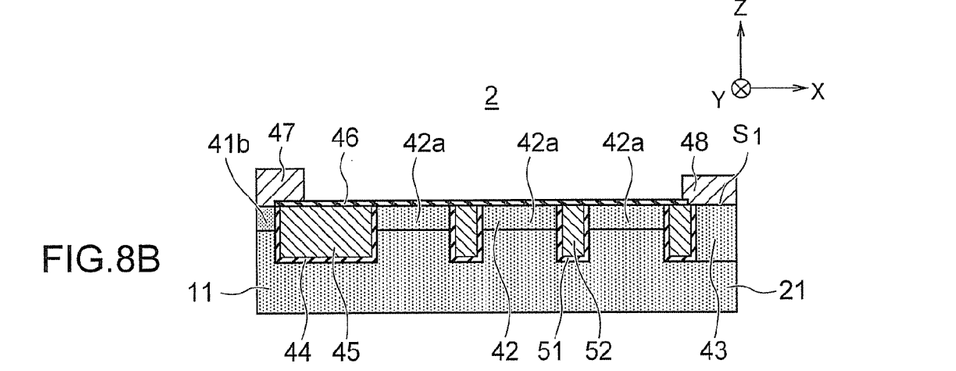
Figure 8C:
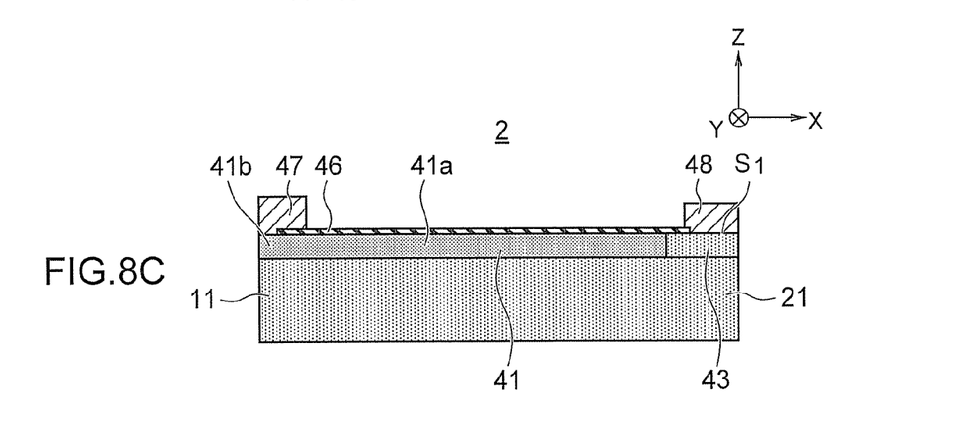

FIGS. 8A to 8C are a plan view and sectional views showing a structure of a junction terminal portion 2 of a third embodiment. FIG. 8A is the plan view showing the structure of the junction terminal portion 2 near the line I-I' in FIG. 1A, and FIGS. 8B and 8C are the sectional views respectively taken along the line A-A' and the line B-B' in FIG. 8A.

In the junction terminal portion 2 in FIGS. 8A to 8C, each of the P-type stripe regions 41a and the N-type stripe region 42a has a rectangular planar shape, and a Y-directional width of the P-type stripe regions 41a and a Y-directional width of the N-type stripe regions 42a are both constant.

In the junction terminal portion 2 in FIGS. 8A to 8C, a region between the P-type stripe regions 41a which are adjacent to each other in the Y direction includes two or more (herein, three) N-type stripe regions 42a which are separated from each other in the X direction, and one or more (herein, two) trench electrodes 52 which are embedded between these separated N-type stripe regions 42a. A trench electrode 52 is further embedded between an N-type stripe region 42a and the N+-type diffusion layer 43. These trench electrodes 52 are embedded in trenches formed on the first main surface $S_1$ of the semiconductor substrate 11 via trench insulators 51.

In the present embodiment, an X-directional width of the trench electrodes 52 is set smaller than an X-directional width of the separated N-type stripe regions 42a. In the present embodiment, bottom surfaces of the trench electrodes 52 are located deeper than the bottom surfaces of the P-type diffusion layer 41 and the N-type diffusion layer 42, and are substantially located at the same depth as the bottom surfaces of the trench electrodes 45. It is noted that the depths of the bottom surfaces of the P-type diffusion layer 41 and the N-type diffusion layer 42 may be different from each other, as described in the first and second embodiments.

In the present embodiment, as similarly to the first and second embodiments, the dose amounts Cp and Cn are both uniform, and the dose amount Cp is set larger than the dose amount Cn (for example, set twice to four times larger than the dose amount Cn). This is similarly applied to a fourth embodiment described below.

The trench electrodes 52 of the present embodiment are used to control an electric field or an electric potential in the P-type diffusion layer 41, the N-type diffusion layer 42, and the N+-type diffusion layer 43. As illustrated in FIG. 8B, the junction terminal portion 2 of the present embodiment has such a structure that a guard ring including plural P-type layers and plural N-type layers is replaced with a pseudo guard ring including the plural trench electrodes 52 and the plural N-type stripe regions 42a. Therefore, according to the present embodiment, a function similar to that of the guard ring is realized by the trench electrodes 52 and the N-type stripe regions 42a, so that a main breakdown voltage can be secured.

As described above, the junction terminal portion 2 of the present embodiment has the super junction structure formed by the P-type stripe regions 41a and the N-type stripe regions 42a. In addition, the junction terminal portion 2 of the present embodiment has the pseudo guard ring formed by the N-type stripe regions 42a and the trench electrodes 52. Therefore, according to the present embodiment, a sufficient breakdown voltage can be secured with a small-sized junction terminal portion 2 due to these structures.

In the present embodiment, the planar shape of each P-type and N-type stripe regions 41a and 42a may be a shape other than the rectangle.

Fourth Embodiment

Figure 9A:
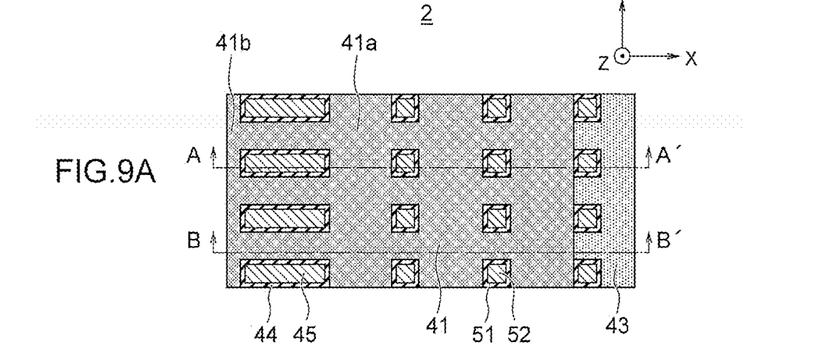
FIGS. 9A to 9C are a plan view and sectional views showing a structure of a junction terminal portion of a fourth embodiment.
Figure 9B:
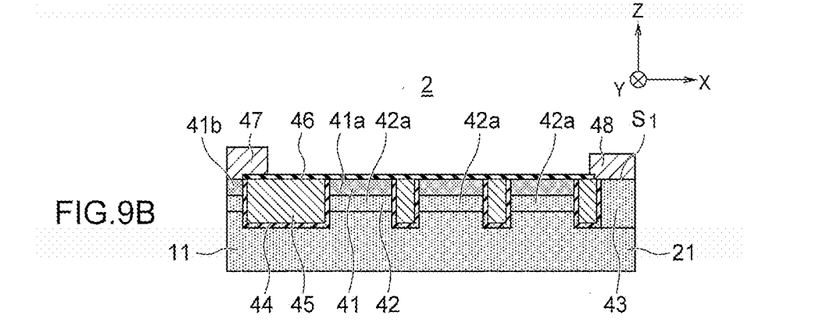
Figure 9C:
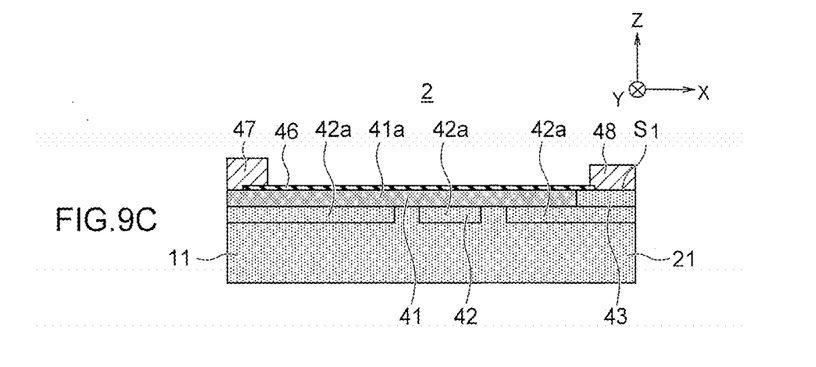

FIGS. 9A to 9C are a plan view and sectional views showing a structure of a junction terminal portion 2 of a fourth embodiment. FIG. 9A is the plan view showing the structure of the junction terminal portion 2 near the line I-I' in FIG. 1A, and FIGS. 9B and 9C are the sectional views respectively taken along the line A-A' and the line B-B' in FIG. 9A.

In the junction terminal portion 2 of the first to third embodiments, the P-type stripe regions 41a and the N-type stripe regions 42a are adjacent in the horizontal direction. On the other hand, in the junction terminal portion 2 of the fourth embodiment, the P-type diffusion layer 41 having one P-type stripe region 41a and the N-type diffusion layer 42 having two or more (herein, three) N-type stripe regions 42a are adjacent in the vertical direction.

Specifically, the P-type stripe region 41a in FIGS. 9A to 9C is formed near the first main surface $S_1$ of the semiconductor substrate 11 in the semiconductor substrate 11. The N-type stripe regions 42a in FIGS. 9A to 9C are formed in the semiconductor substrate 11 to be adjacent to the P-type stripe region 41a in the Z direction (i.e., a depth direction of the semiconductor substrate 11), and separated from each other in the X direction.

The junction terminal portion 2 in FIGS. 9A to 9C further includes the trench electrodes 52 disposed to penetrate the P-type stripe region 41a and to be sandwiched between the separated N-type stripe regions 42a. The junction terminal portion 2 in FIGS. 9A to 9C further includes other trench electrodes 52 which are disposed between the N+-type diffusion layer 43 and the P-type and N-type diffusion layers 41 and 42. These trench electrodes 52 are embedded in the trenches formed on the first main surface $S_1$ of the semiconductor substrate 11 via the trench insulators 51, and are used to control an electric field or an electric potential in the P-type diffusion layer 41, the N-type diffusion layer 42, and the N+-type diffusion layer 43.

The junction terminal portion 2 of the present embodiment has a PN junction structure formed by the P-type stripe region 41a and the N-type stripe regions 42a. The junction terminal portion 2 of the present embodiment further has the pseudo guard ring formed by the N-type stripe regions 42a and the trench electrodes 52 as similarly to the third embodiment. Therefore, according to the present embodiment, a sufficient breakdown voltage can be secured with a small-sized junction terminal portion 2 due to these structures.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a semiconductor substrate;
   a device portion disposed in the semiconductor substrate; and
   a junction terminal portion disposed in the semiconductor substrate and having an annular shape surrounding the device portion, the junction terminal portion including first semiconductor regions of a first conductivity type and second semiconductor regions of a second conductivity type, the first semiconductor regions being adjacent to each other in a circumferential direction of the annular shape of the junction terminal portion, and having a width decreasing with progressing in a direction away from the device portion, and the second semiconductor regions being disposed between the first semiconductor regions, and having a width increasing with progressing in the direction away from the device portion.

2. The device of claim 1, wherein both a dose amount of impurities of the first conductivity type in the first semiconductor regions and a dose amount of impurities of the second conductivity type in the second semiconductor regions are uniform.

3. The device of claim 1, wherein a dose amount of impurities of the first conductivity type in the first semiconductor regions is larger than a dose amount of impurities of the second conductivity type in the second semiconductor regions.

4. The device of claim 3, wherein the dose amount of the impurities of the first conductivity type in the first semiconductor regions is twice to four times larger than the dose amount of the impurities of the second conductivity type in the second semiconductor regions.

5. The device of claim 1, wherein a depth of bottom surfaces of the second semiconductor regions is deeper than a depth of bottom surfaces of the first semiconductor regions.

6. The device of claim 5, wherein the second semiconductor regions are in contact with the bottom surfaces of the first semiconductor regions.

7. The device of claim 1, wherein a depth of bottom surfaces of the first semiconductor regions is deeper than a depth of bottom surfaces of the second semiconductor regions.

8. The device of claim 7, wherein the first semiconductor regions are in contact with the bottom surfaces of the second semiconductor regions.

9. The device of claim 1, wherein the first and second semiconductor regions have triangular planar shapes.

10. The device of claim 1, wherein the junction terminal portion further includes:
a first connection region of the first conductivity type connecting the first semiconductor regions;
a second connection region of the second conductivity type connecting the second semiconductor regions; and
a trench electrode disposed in a trench via a trench insulator, the trench being provided to penetrate the first connection region.

11. A semiconductor device comprising:
a semiconductor substrate;
a device portion disposed in the semiconductor substrate; and a junction terminal portion disposed in the semiconductor substrate and having an annular shape surrounding the device portion, the junction terminal portion including first semiconductor regions of a first conductivity type and second semiconductor regions of a second conductivity type,
the first semiconductor regions being adjacent to each other in a circumferential direction of the annular shape of the junction terminal portion, and the second semiconductor regions being disposed between the first semiconductor regions, wherein a region between first semiconductor regions adjacent to each other includes:
two or more second semiconductor regions separated from each other in a direction away from the device portion; and
one or more electrodes disposed between the separated second semiconductor regions.

12. The device of claim 11, wherein both a dose amount of impurities of the first conductivity type in the first semiconductor regions and a dose amount of impurities of the second conductivity type in the second semiconductor regions are uniform.

13. The device of claim 11, wherein a dose amount of impurities of the first conductivity type in the first semiconductor regions is larger than a dose amount of impurities of the second conductivity type in the second semiconductor regions.

14. The device of claim 11, wherein a width of the first semiconductor regions and a width of the second semiconductor regions in the circumferential direction are constant.

15. The device of claim 11, wherein a depth of bottom surfaces of the electrodes is deeper than a depth of bottom surfaces of the second semiconductor regions.

16. The device of claim 11, wherein a width of the electrodes is smaller than a width of the second semiconductor regions.

17. A semiconductor device comprising:
a semiconductor substrate;
a device portion disposed in the semiconductor substrate; and
a junction terminal portion disposed in the semiconductor substrate and having an annular shape surrounding the device portion, the junction terminal portion including one first semiconductor region of a first conductivity type, two or more second semiconductor regions of a second conductivity type, and one or more electrodes,
the first semiconductor region being disposed near a surface of the semiconductor substrate in the semiconductor substrate,
the second semiconductor regions being disposed in the semiconductor substrate so as to be adjacent to the first semiconductor region in a depth direction of the semiconductor substrate, and being separated from each other in a direction away from the device portion,
the electrodes being disposed to penetrate the first semiconductor region and to be sandwiched between the separated second semiconductor regions, and
the one first semiconductor region is in contact with the two or more second semiconductor regions separated from each other.

18. The device of claim 17, wherein both a dose amount of impurities of the first conductivity type in the first semiconductor region and a dose amount of impurities of the second conductivity type in the second semiconductor regions are uniform.

19. The device of claim 17, wherein a dose amount of impurities of the first conductivity type in the first semiconductor region is larger than a dose amount of impurities of the second conductivity type in the second semiconductor regions.

20. The device of claim 17, wherein a depth of bottom surfaces of the electrodes is deeper than a depth of bottom surfaces of the second semiconductor regions.

* * * * *